US012062671B2

United States Patent
Wang et al.

(10) Patent No.: US 12,062,671 B2
(45) Date of Patent: Aug. 13, 2024

(54) IMAGE SENSOR WITH PHOTOSENSITIVITY ENHANCEMENT REGION

(71) Applicant: Taiwan Semiconductor Manufacturing Company, Ltd., Hsinchu (TW)

(72) Inventors: Tzu-Jui Wang, Fengshan (TW); Yuichiro Yamashita, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 383 days.

(21) Appl. No.: 17/349,202

(22) Filed: Jun. 16, 2021

(65) Prior Publication Data

US 2022/0406823 A1  Dec. 22, 2022

(51) Int. Cl.
*H01L 27/146* (2006.01)
*H01L 31/107* (2006.01)

(52) U.S. Cl.
CPC .... *H01L 27/1461* (2013.01); *H01L 27/14607* (2013.01); *H01L 27/1464* (2013.01); *H01L 27/14683* (2013.01); *H01L 31/107* (2013.01)

(58) Field of Classification Search
CPC ........... H01L 27/1461; H01L 27/14607; H01L 27/1464; H01L 27/14683; H01L 31/107; H01L 27/146; H01L 27/1463; H01L 27/14603; H01L 27/14609; H01L 27/14643; H01L 27/14689
See application file for complete search history.

(56) References Cited

U.S. PATENT DOCUMENTS

| 10,153,310 B2 * | 12/2018 | Zhang | H01L 31/107 |
| 2005/0255625 A1 * | 11/2005 | Janesick | H01L 27/14609 |
| | | | 438/57 |

FOREIGN PATENT DOCUMENTS

CN  105185796 A  * 12/2015

OTHER PUBLICATIONS

Ejdehakosh et al. "Electrical μ-Lens Synthesis Using Dual-Junction Single-Photon Avalanche Diode." Iranian Journal of Electrical and Electronic Engineering 04 (2019) 502-508, published Dec. 2019.
(Continued)

*Primary Examiner* — Eduardo A Rodela
(74) *Attorney, Agent, or Firm* — Eschweiler & Potashnik, LLC

(57) ABSTRACT

The present disclosure relates to an image sensor including a pixel along a substrate. The pixel includes a first semiconductor region having a first doping type. A second semiconductor region is directly over the first semiconductor region. The second semiconductor region has a second doping type opposite the first doping type and meets the first semiconductor region at a p-n junction. A ring-shaped third semiconductor region laterally surrounds the first and second semiconductor regions. The ring-shaped third semiconductor region has the first doping type. A ring-shaped fourth semiconductor region laterally surrounds the ring-shaped third semiconductor region. The ring-shaped fourth semiconductor region has the second doping type. A ring-shaped fifth semiconductor region is directly over the ring-shaped third semiconductor region and has the second doping type.

20 Claims, 12 Drawing Sheets

(56) References Cited

OTHER PUBLICATIONS

Acerbi et al. "Understanding and Simulating SiPMs." Nuclear Inst. and Methods in Physics Research, A 926 (2019) 16-35, published on Dec. 3, 2018.

* cited by examiner

IMAGE SENSOR WITH PHOTOSENSITIVITY ENHANCEMENT REGION

BACKGROUND

Integrated circuits (ICs) with complementary metal-oxide-semiconductor (CMOS) image sensors are used in a wide range of modern-day electronic devices, such as, for example, cameras and cell phones. Some CMOS image sensors are based on avalanche photodiodes (APD) and single-photon avalanche photodiodes (SPAD). Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
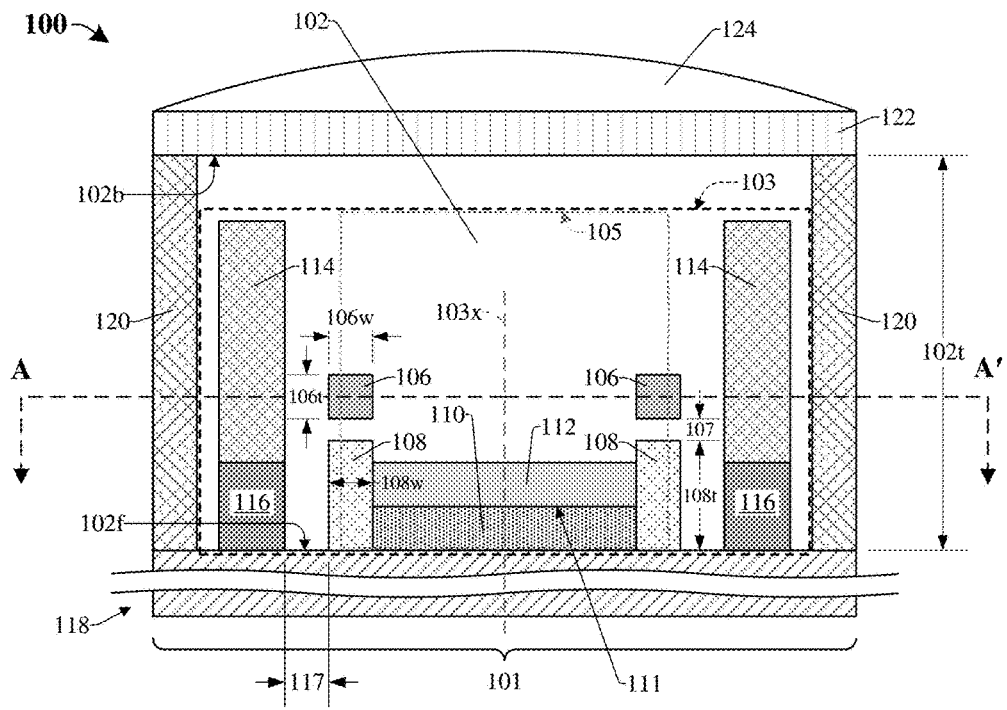
FIG. 1 illustrates a cross-sectional view of some embodiments of a back-side illuminated image sensor comprising a photosensitivity enhancement semiconductor region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include single-photon avalanche diodes (SPADs) for detecting photons. For example, an image sensor includes a plurality of pixels along a substrate. A pixel of the plurality of pixels comprises a SPAD in the substrate along a front-side of the substrate. The SPAD includes a first semiconductor region and a second semiconductor region directly over the first semiconductor region. The first semiconductor region has a first doping type and the second semiconductor region has a second doping type opposite the first doping type. As a result, a p-n junction exists at an interface where the first and second semiconductor regions meet. The pixel further includes a guard ring that surrounds both the first and second semiconductor regions. The guard ring has the first doping type. In addition, a contact semiconductor region surrounds the guard ring and is laterally separated from the guard ring by the substrate. The guard ring is designed to relax the high electric field of the SPAD along the perimeter of the SPAD to prevent a premature edge breakdown.

A challenge with the image sensor is that the guard ring must be large to relax the high electric field of the SPAD, but carriers generated by photons absorbed directly over the guard ring are not usually able to trigger an avalanche current (i.e., the photon may not be detected). Thus, the guard ring reduces an active area of the SPAD and hence a fill factor and/or photon detection efficiency (PDE) of the SPAD may also be reduced. As a result, a performance of the image sensor may be low.

Another challenge is that a spacing between the guard ring and contact region must be sufficient to prevent a premature edge breakdown and to prevent a high dark count rate. This spacing further reduces the active area of the SPAD because carriers generated by photons absorbed in the spacing are also not usually able to trigger an avalanche. As such, a large area of the pixel may be inactive (i.e., may not be photo-sensitive). Thus, the fill factor and/or the PDE of the SPAD may be low.

Various embodiments of the present disclosure are related to an image sensor comprising a photosensitivity enhancement (PE) semiconductor region for improving a performance of the image sensor. The image sensor comprises a pixel along a substrate. The pixel comprises a photodetector (e.g., a SPAD or the like) in the substrate along a front-side of the substrate. The photodetector comprises a first semiconductor region that extends along the front-side of the substrate and a second semiconductor region that is directly over the first semiconductor region. The first semiconductor region comprises a first doping type and the second semiconductor region has a second doping type opposite the first doping type. A p-n junction exists at an interface between the first and second semiconductor regions. A guard ring semiconductor region is in the substrate and extends along the front-side of the substrate. The guard ring semiconductor region surrounds the first and second semiconductor regions and has the first doping type. A contact semiconductor region is in the substrate and extends along the front-side of the substrate. The contact semiconductor region surrounds the guard ring and is separated from the guard ring. Further, the contact semiconductor region has the second doping type. In addition, a PE semiconductor region is directly over the guard ring semiconductor region and has the second doping type. Further, the PE semiconductor region has a ring-shaped top layout. The PE semiconductor region is configured to enlarge an active area of the image sensor.

By including the PE semiconductor region directly over the guard ring semiconductor region, the active area of the image sensor may be enlarged without changing the layout of the image sensor. For example, the high electric field of the photodetector that enables an avalanche current to be produced may be laterally extended toward the guard ring semiconductor region. Thus, carriers generated by photons absorbed over the guard ring semiconductor region may have a greater chance of triggering an avalanche current (i.e., a greater chance of being detected). Further, the PE semiconductor region may reduce a depletion region of the photodetector over the guard ring semiconductor region such that carriers generated by photons absorbed over the guard ring semiconductor region may travel laterally toward the high electric field of the photodetector and hence may have a greater chance of triggering an avalanche current. Thus, the active area of the image sensor may be enlarged. As a result, a performance (e.g., a fill factor and/or a photon detection efficiency) of the image sensor may be improved.

Figure 2:
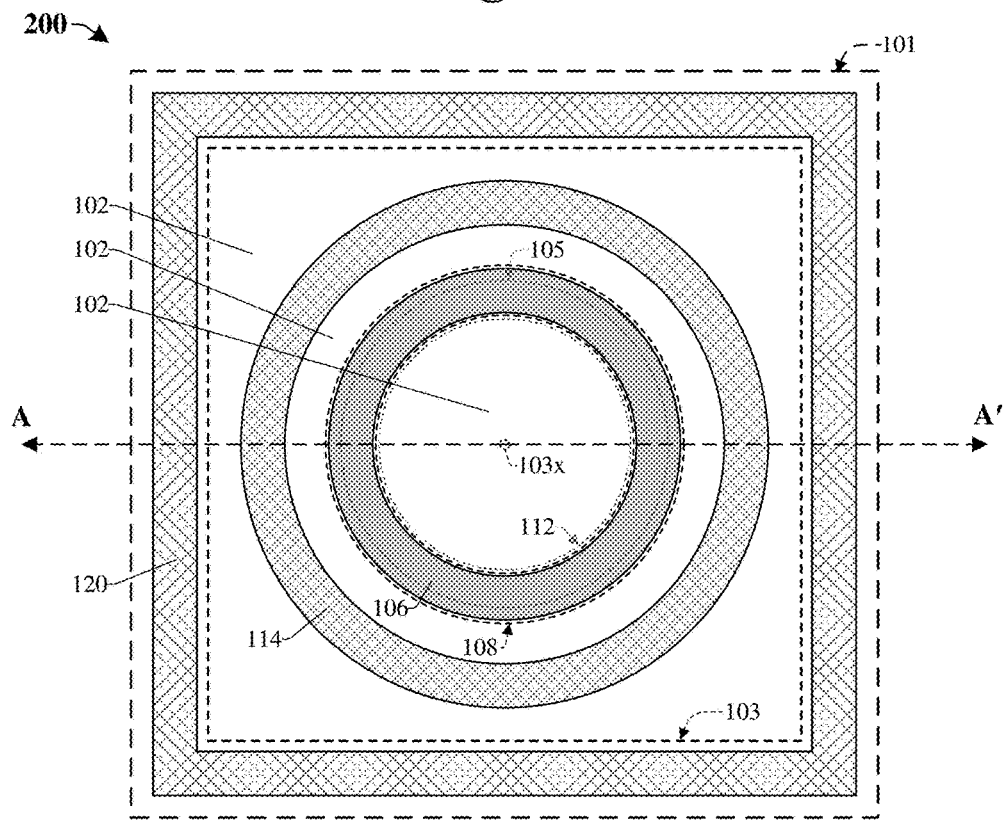
FIG. 2 illustrates a top view of some embodiments of the image sensor of FIG. 1.

Referring to FIGS. 1 and 2 simultaneously, FIG. 1 illustrates a cross-sectional view 100 of some embodiments of a back-side illuminated image sensor comprising a photosensitivity enhancement (PE) semiconductor region 106, and FIG. 2 illustrates a top view 200 of some embodiments of the image sensor of FIG. 1. The cross-sectional view 100 of FIG. 1 may, for example, be taken across line A-A' of FIG. 2.

In such embodiments, the image sensor comprises a pixel 101 along a substrate 102. The pixel 101 comprises a photodetector 103 in the substrate 102. The photodetector 103 comprises a first semiconductor region 110 that extends along a front-side 102*f* of the substrate 102. The photodetector 103 further comprises a second semiconductor region 112 directly over the first semiconductor region 110. The first semiconductor region 110 has a first doping type (e.g., n-type) and the second semiconductor region 112 has a second doping type (e.g., p-type) opposite the first doping type. The first semiconductor region 110 meets the second semiconductor region 112 at a p-n junction 111. A high electric field may exist along the p-n junction 111 due to a large reverse bias applied to the photodetector 103.

The photodetector 103 further comprises a guard ring semiconductor region 108 that extends along the front-side 102*f* of the substrate 102. The guard ring semiconductor region 108 laterally surrounds both the first semiconductor region 110 and the second semiconductor region 112. The guard ring semiconductor region 108 has a ring-shaped top layout. Further, the guard ring semiconductor region 108 has the first doping type. In some embodiments, the guard ring semiconductor region 108 abuts the first semiconductor region 110 and the second semiconductor region 112 along sidewalls of the first and second semiconductor regions 110, 112. The guard ring semiconductor region 108 relaxes the high electric field that exists along the perimeter of the p-n junction 111 to prevent a premature edge breakdown from occurring in the image sensor.

In addition, the photodetector 103 comprises a contact semiconductor region 116 that extends along the front-side 102*f* of the substrate 102. The contact semiconductor region 116 laterally surrounds the guard ring semiconductor region 108 at a first distance 117 from the guard ring semiconductor region 108. The contact semiconductor region 116 also has a ring-shaped top layout. The contact semiconductor region 116 has the second doping type and is separated from the guard ring semiconductor region 108 by the substrate 102.

Further, the photodetector 103 comprises an isolation semiconductor region 114 directly over the contact semiconductor region 116. The isolation semiconductor region 114 has the second doping type and has a ring-shaped top layout similar to that of the contact semiconductor region 116. The isolation semiconductor region 114 may electrically and/or optically isolate the photodetector 103 along a boundary of the photodetector.

Furthermore, the photodetector 103 comprises a photosensitivity enhancement (PE) semiconductor region 106 that is directly over the guard ring semiconductor region 108 and that is vertically separated from the guard ring semiconductor region 108 by a non-zero distance 107. Further, the PE semiconductor region 106 has the second doping type and has a ring-shaped top layout that is approximately the same as, or similar to, that of the guard ring semiconductor region 108. In some embodiments, the guard ring semiconductor region 108 and the PE semiconductor region 106 are concentric about a center 103*x* (e.g., a central axis) of the photodetector 103. In some embodiments, the contact semiconductor region 116 may also be concentric about the center 103*x* of the photodetector 103. The PE semiconductor region 106 is configured to enlarge an area of the image sensor that is sensitive to photons.

For example, an active area 105 of the pixel 101 may extend beyond an inner sidewall of the guard ring semiconductor region 108. In some embodiments, an area of the active area 105 may, for example, be greater than about 40% of an area of the photodetector 103 such that a fill factor of the image sensor is greater than about 40%.

By including the PE semiconductor region 106 in the photodetector 103 and directly over the guard ring semiconductor region 108, an active area (e.g., 105) of the image sensor may be enlarged. For example, the high electric field of the photodetector 103 that allows for an avalanche current to be triggered may be laterally extended toward the guard ring semiconductor region 108. Thus, carriers generated by photons absorbed over the guard ring semiconductor region 108 may have a greater chance of triggering an avalanche current (i.e., a greater chance of being detected). Further, the PE semiconductor region 106 may reduce a depletion region of the photodetector 103 over the guard ring semiconductor region 108 such that carriers generated by photons absorbed over the guard ring semiconductor region 108 may travel laterally toward the high electric field of the photodetector 103 and hence may have a greater chance of triggering an avalanche current. Thus, the active area (e.g., 105) of the image sensor may be increased. As a result, a performance (e.g., a fill factor and/or a photon detection efficiency) of the image sensor may be improved.

In some embodiments, the image sensor further comprises a trench isolation structure 120 that surrounds the pixel 101 along a border of the pixel. The trench isolation structure 120 may electrically and/or optically isolate the pixel 101 from neighboring pixels (not shown). In some embodiments, the trench isolation structure 120 may, for example, comprise silicon oxide, silicon nitride, aluminum oxide, aluminum nitride, some other suitable dielectric, or any combination of the foregoing.

Further, in some embodiments, the image sensor comprises a color filter 122 and a lens 124 extending along a back-side of the substrate 102. The lens 124 is directly over the color filter 122. Photons may enter the pixel 101 through the lens 124 such that the image sensor is back-side illuminated.

Furthermore, in some embodiments, an interconnect structure 118 extends along the front-side 102f of the substrate 102. The interconnect structure 118 may, for example, comprise one or more contacts, metal wires, vias, solder bumps, bond pads, or the like. Further, the interconnect structure 118 may be electrically connected to the photodetector 103.

In some embodiments, the substrate 102 may, for example, comprise silicon or the like. Further, the substrate 102 may have the second doping type. Furthermore, in some embodiments, any of the first semiconductor region 110, the second semiconductor region 112, the guard ring semiconductor region 108, the contact semiconductor region 116, the isolation semiconductor region 114, and the PE semiconductor region 106 may, for example, comprise doped silicon or the like.

In some embodiments, any of the first semiconductor region 110 and the contact semiconductor region 116 may be heavily doped (e.g., n+ or p+ doping). For example, any of the first semiconductor region 110 and the contact semiconductor region 116 may, for example, have doping concentrations greater than $1 \times 10^{18}$ $cm^{-3}$.

Further, in some embodiments, any of the second semiconductor region 112, the guard ring semiconductor region 108, and the PE semiconductor region 106 may be lightly doped (e.g., n− or p− doping). For example, any of the second semiconductor region 112, the guard ring semiconductor region 108, and the PE semiconductor region 106 may, for example, have doping concentrations of about $1 \times 10^{16}$ $cm^{-3}$ to about $1 \times 10^{18}$ $cm^{-3}$.

In some embodiments, the PE semiconductor region 106 may, for example have a width 106w of about 0.2 micrometers to 5 micrometers. Further, the PE semiconductor region 106 may, for example, have a thickness 106t of about 0.2 micrometers to about 2 micrometers. In some embodiments, the guard ring semiconductor region 108 may, for example, have a thickness 108t of about 0.3 micrometers to about 2 micrometers or some other suitable value. In some embodiments, the distance 107 between the PE semiconductor region 106 and the guard ring semiconductor region 108 may, for example, be about 0.1 micrometers to about 1 micrometer or some other suitable value. In some embodiments, the width 106w of the PE semiconductor region 106 is approximately equal to a width 108w of the guard ring semiconductor region 108. Further in some embodiments, a thickness 102t of the substrate 102 may, for example, be about 2 micrometers to about 7 micrometers or some other suitable value.

Figure 3:
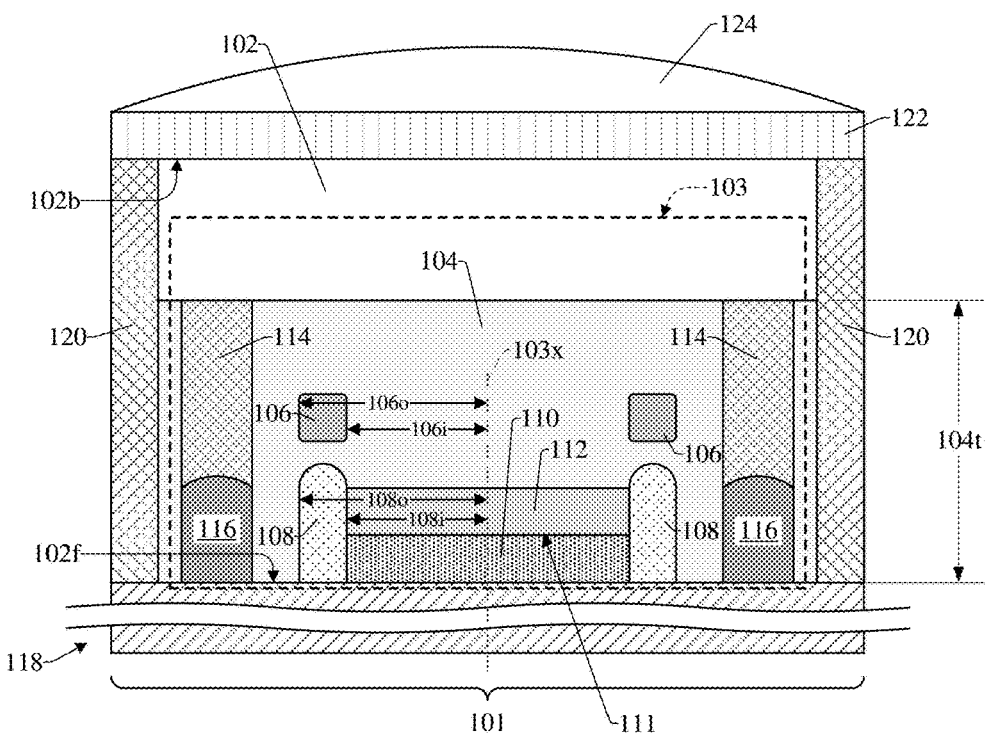
FIG. 3 illustrates a cross-sectional view of some embodiments of an image sensor in which a photosensitivity enhancement semiconductor region is in a semiconductor well.

FIG. 3 illustrates a cross-sectional view 300 of some embodiments of an image sensor in which a photosensitivity enhancement (PE) semiconductor region 106 is in a semiconductor well 104.

In such embodiments, the semiconductor well 104 extends into the substrate 102 from a front-side 102f of the substrate 102. Further, in such embodiments, the substrate 102 has the first doping type and the semiconductor well 104 has the second doping type. In some embodiments, a thickness 104t of the semiconductor well 104 may, for example, be about 2 micrometers to about 7 micrometers or some other suitable value.

In some embodiments, a radius 106o of an outer sidewall of the PE semiconductor region 106 and a radius 108o of an outer sidewall of the guard ring semiconductor region 108, as measured from the center 103x of the photodetector 103, are approximately equal (i.e., an outer sidewall of the PE semiconductor region 106 and an outer sidewall of the guard ring semiconductor region 108 are vertically aligned, when viewed in cross-section). Further, in some embodiments, a radius 106i of an inner sidewall of the PE semiconductor region 106 and a radius 108i of an inner sidewall of the guard ring semiconductor region 108, as measured from the center 103x of the photodetector 103, are approximately equal (i.e., an inner sidewall of the PE semiconductor region 106 and an inner sidewall of the guard ring semiconductor region 108 are vertically aligned, when viewed in cross-section). This may be the result of using a common mask to when forming the PE semiconductor region 106 and the guard ring semiconductor region 108. By using a common mask to form the PE semiconductor region 106 and the guard ring semiconductor region 108, a cost of producing the image sensor may be reduced and/or a time required to produce the image sensor may be reduced.

Figure 4:
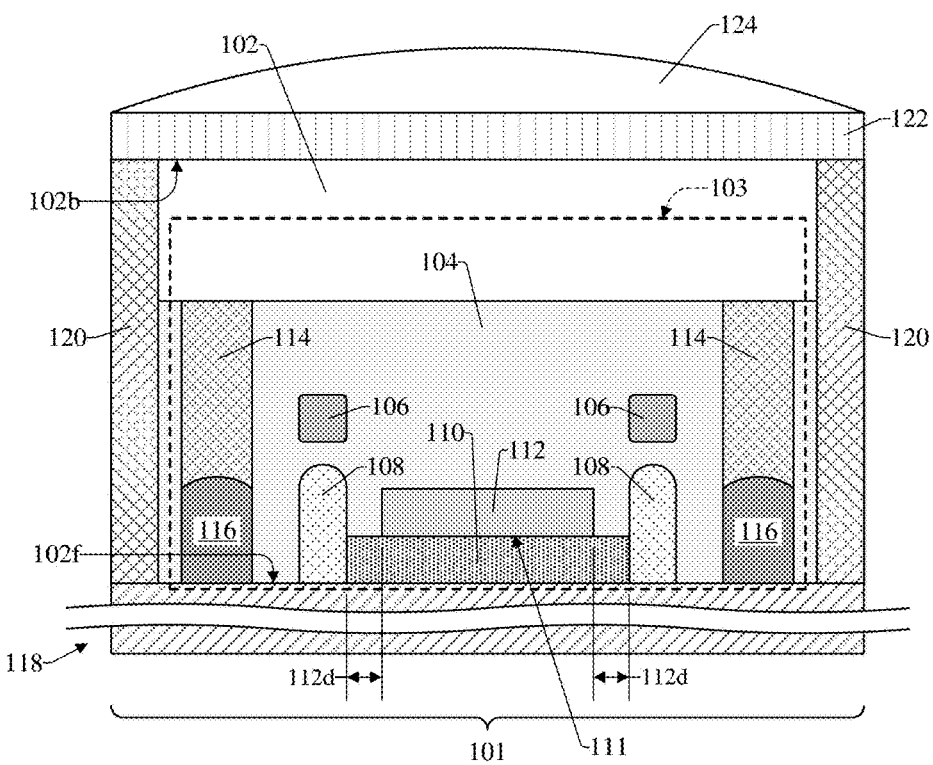
FIGS. 4-6 illustrate cross-sectional views of some alternative embodiments of the image sensor of FIG. 3.
Figure 5:
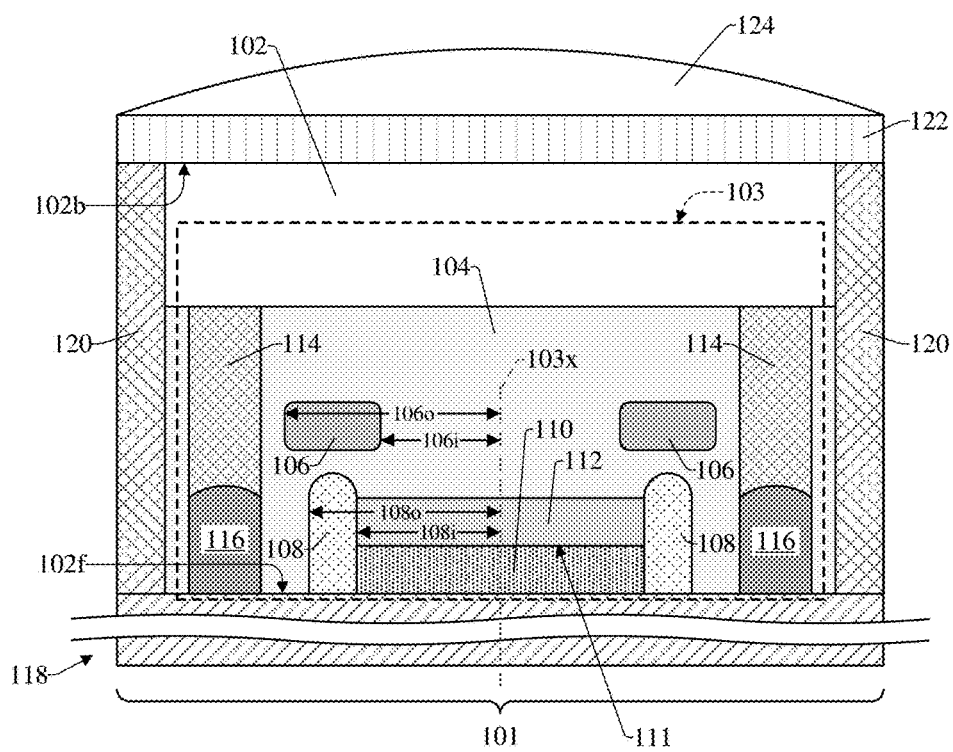
Figure 6:
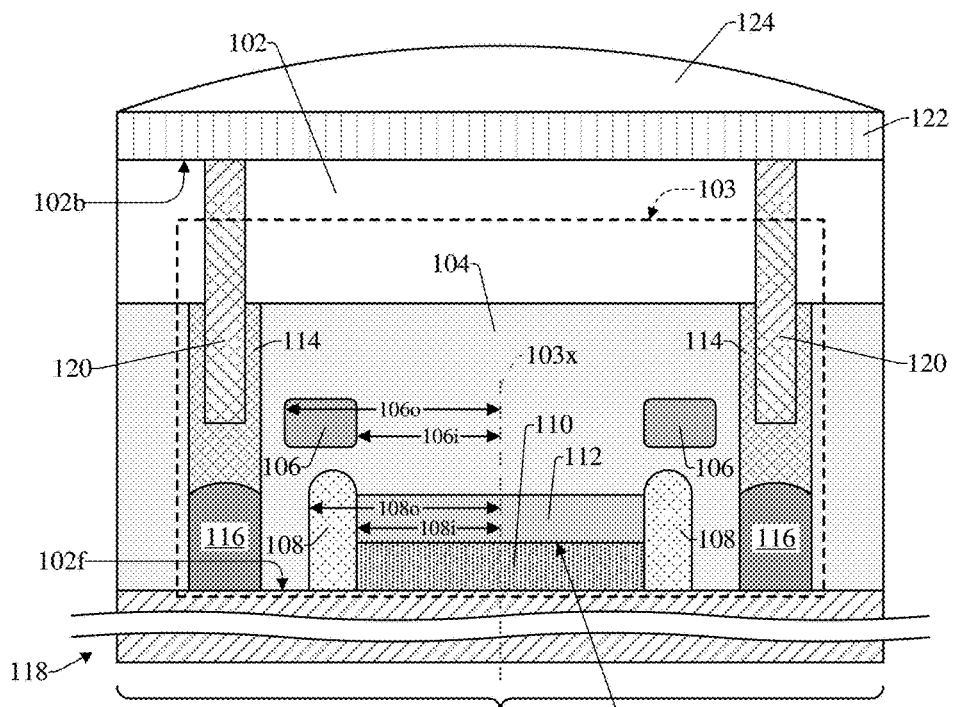

FIGS. 4-6 illustrate cross-sectional views 400-600 of some alternative embodiments of the image sensor of FIG. 3.

In some embodiments (see, for example, FIG. 4), the second semiconductor region 112 is laterally separated from sidewalls of the guard ring semiconductor region 108 by a non-zero distance 112d. By including the non-zero distance 112d between the second semiconductor region 112 and the guard ring semiconductor region 108, the high electric field at the p-n junction 111 of the photodetector 103 may be reduced along a perimeter of the p-n junction 111. As a result, a dark count rate of the photodetector 103 may be reduced, thereby improving a performance of the image sensor.

In some embodiments (see, for example, FIGS. 5 and 6), the PE semiconductor region 106 has a width (not labeled) that is greater than a width (not labeled) of the guard ring semiconductor region 108. By increasing the width of the PE semiconductor region 106, an active area of the photodetector 103 may be further increased. Thus, a performance of the image sensor may be further enhanced.

In some embodiments (see, for example, FIG. 5), an inner sidewall of the PE semiconductor region 106 is closer to the center 103x of the photodetector 103 than is an inner sidewall of the guard ring semiconductor region 108, and an outer sidewall of the PE semiconductor region 106 is further from the center 103x of the photodetector 103 than is an outer sidewall of the guard ring semiconductor region 108. In other words, a radius 106o of an outer sidewall of the PE semiconductor region 106 is greater than a radius 108o of an outer sidewall of the guard ring semiconductor region 108, while a radius 106i of an inner sidewall of the PE semiconductor region 106 is less than a radius 108i of an inner sidewall of the guard ring semiconductor region 108.

In some embodiments (see, for example, FIG. 6), an inner sidewall of the PE semiconductor region 106 is a same distance from the center 103x of the photodetector 103 as an inner sidewall of the guard ring semiconductor region 108 (i.e., an inner sidewall of the PE semiconductor region 106 may be vertically aligned with an inner sidewall of the guard ring semiconductor region 108, when viewed in cross-section), while an outer sidewall of the PE semiconductor region 106 is further from the center 103x of the photodetector 103 than is an outer sidewall of the guard ring semiconductor region 108. In other words, a radius 106o of an outer sidewall of the PE semiconductor region 106 is greater than a radius 108o of an outer sidewall of the guard ring semiconductor region 108, while a radius 106i of an inner sidewall of the PE semiconductor region 106 is approximately equal to a radius 108i of an inner sidewall of the guard ring semiconductor region 108.

Further, in some embodiments (see, for example, FIG. 6), the trench isolation structure 120 may alternatively extend into the isolation semiconductor region 114 from a back-side 102b of the substrate 102. In such embodiments, the trench isolation structure 120 may electrically and/or optically isolate the pixel 101 from neighboring pixels (not shown) along a boundary of the photodetector 103.

Figure 7:
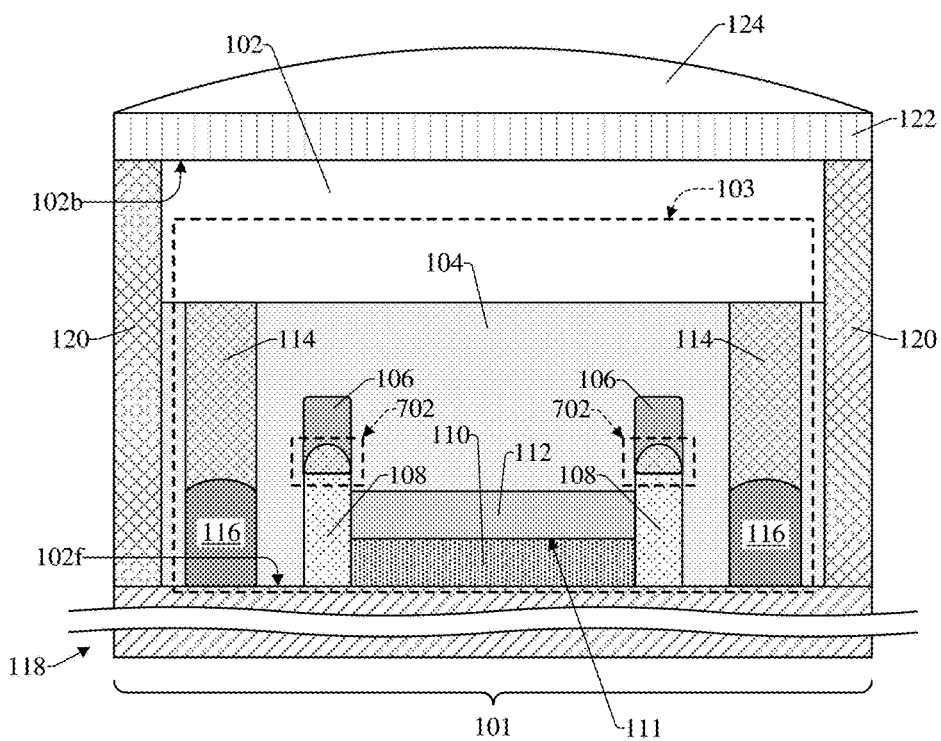
FIG. 7 illustrates a cross-sectional view of some embodiments of an image sensor in which a photosensitivity enhancement semiconductor region neighbors a guard ring semiconductor region.

FIG. 7 illustrates a cross-sectional view 700 of some embodiments of an image sensor in which a photosensitivity enhancement (PE) semiconductor region 106 neighbors a guard ring semiconductor region 108.

In such embodiments, a diffusion region 702 exists in the semiconductor well 104 where the guard ring semiconductor region 108 neighbors the PE semiconductor region 106. In some embodiments, the guard ring semiconductor region 108 meets the PE semiconductor region 106 at the diffusion region 702. In some other embodiments, the guard ring semiconductor region 108 and the PE semiconductor region 106 overlap at the diffusion region 702 such that the diffusion region comprises atoms from both the guard ring semiconductor region 108 and the PE semiconductor region 106. This may be due to the guard ring semiconductor region 108 diffusing into the semiconductor well 104 towards the PE semiconductor region 106 and the PE semiconductor region 106 diffusing into the semiconductor well 104 toward the guard ring semiconductor region 108 over time until the two regions meet or overlap.

Figure 8:
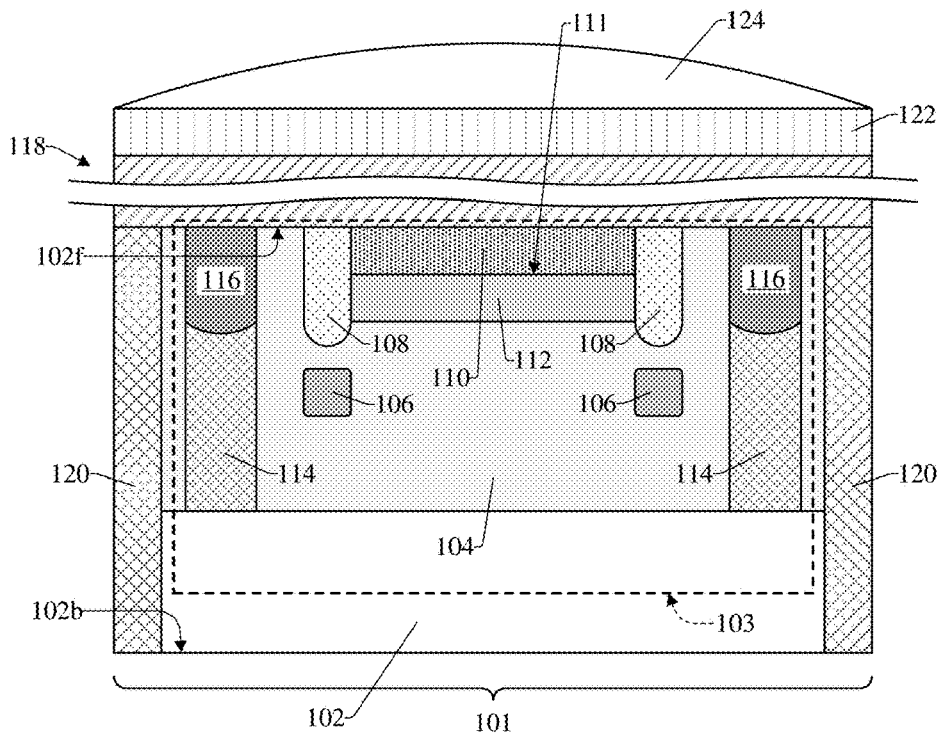
FIG. 8 illustrates a cross-sectional view of some embodiments of a front-side illuminated image sensor comprising a photosensitivity enhancement semiconductor region.

FIG. 8 illustrates a cross-sectional view 800 of some embodiments of a front-side illuminated image sensor comprising a photosensitivity enhancement (PE) semiconductor region 106.

In such embodiments, a color filter 122 and a lens 124 extend along a front-side 102f of the substrate 102 and are over an interconnect structure 118. Radiation (e.g., photons or the like) may enter image sensor through the lens 124 such that the image sensor is front-side illuminated.

Figure 9:
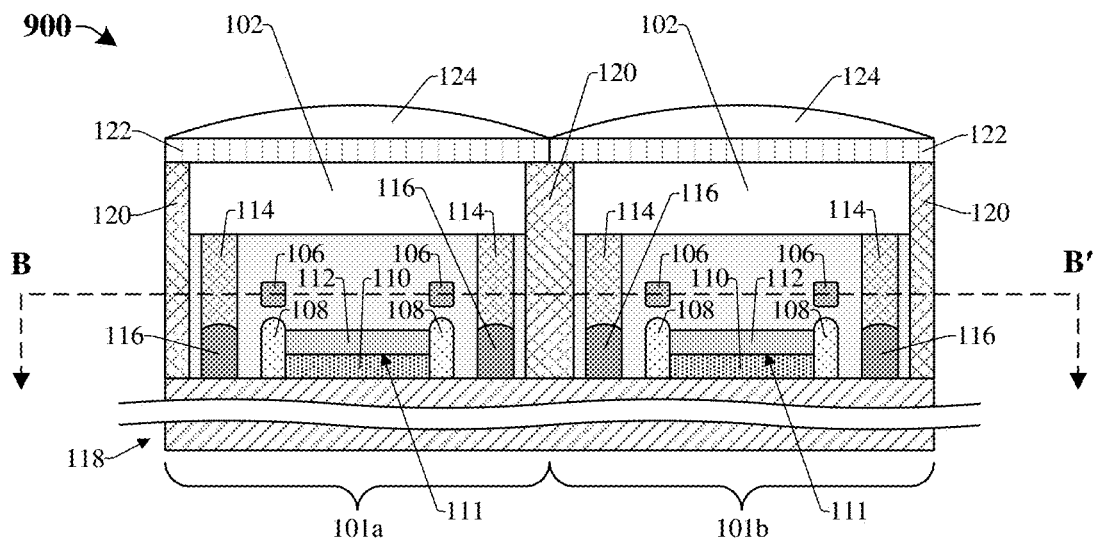
FIG. 9 illustrates a cross-sectional view of some embodiments of an image sensor comprising a plurality of pixels arranged in a pixel array.
Figure 10:
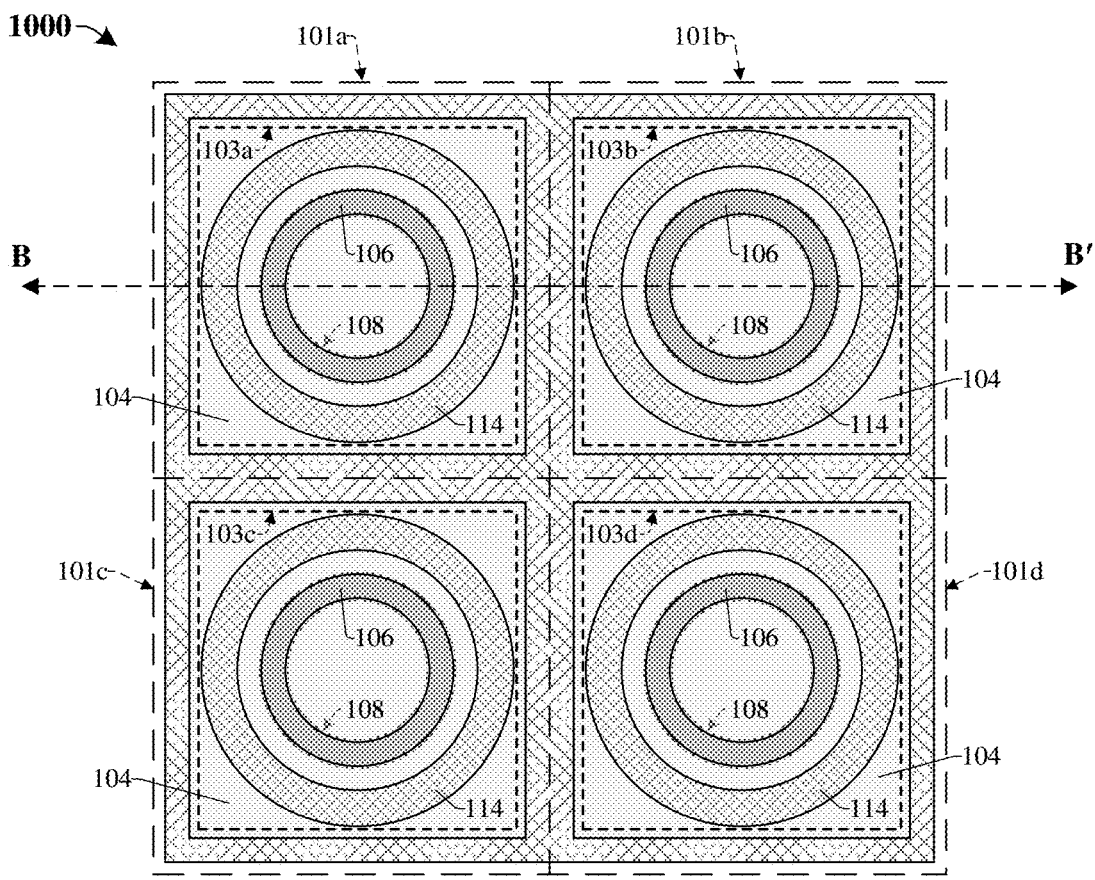
FIG. 10 illustrates a top view of some embodiments of the image sensor of FIG. 9.

Referring to FIGS. 9 and 10 simultaneously, FIG. 9 illustrates a cross-sectional view 900 of some embodiments of an image sensor comprising a plurality of pixels arranged in a pixel array, and FIG. 10 illustrates a top view 1000 of some embodiments of the image sensor of FIG. 9.

In such embodiments, the image sensor may, for example, comprise a two-by-two pixel array (e.g., a first pixel 101a, a second pixel 101b, a third pixel 101c, and a fourth pixel 101d). Pixel arrays of other dimensions are also feasible. In some embodiments, a first pixel 101a neighbors a second pixel 101b. A first photodetector 103a of the first pixel 101a is adjacent to and separated from a second photodetector 103b of the second pixel 101b by a trench isolation structure 120 that extends along a boundary between the first pixel 101a and the second pixel 101b. In some embodiments, the trench isolation structure 120 surrounds and separates each of the photodetectors (e.g., the first photodetector 103a, the second photodetector 103b, a third photodetector 103c, and a fourth photodetector 103d) of the image sensor.

Further, in such embodiments, a PE semiconductor region 106 of the first pixel 101a is laterally adjacent to a PE semiconductor region 106 of the second pixel 101b. In some embodiments, four PE semiconductor regions 106 may be arranged in a two-by-two array according to the two-by-two pixel array.

FIGS. 11-21 illustrate cross-sectional views 1100-2100 of some embodiments of an image sensor comprising a photosensitivity enhancement (PE) semiconductor region. Although FIGS. 11-21 are described in relation to a method, it will be appreciated that the structures disclosed in FIGS. 11-21 are not limited to such a method, but instead may stand alone as structures independent of the method.

Figure 11:
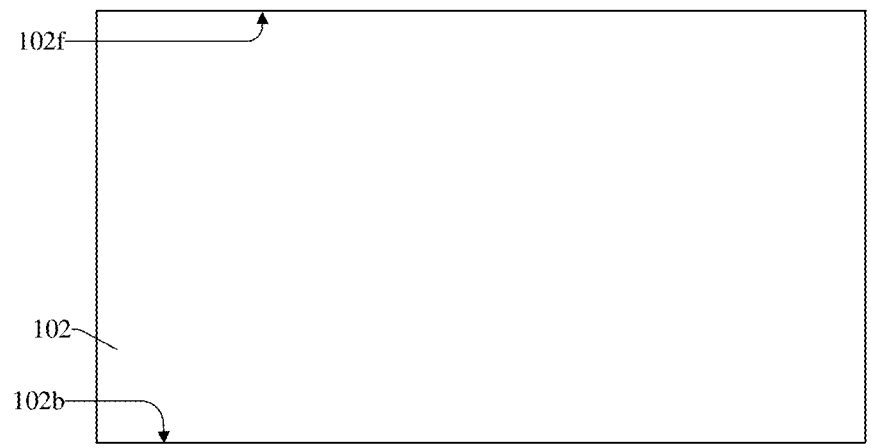
FIGS. 11-21 illustrate cross-sectional views of some embodiments of a method for forming an image sensor comprising a photosensitivity enhancement semiconductor region.

As shown in cross-sectional view 1100 of FIG. 11, a substrate 102 is provided. The substrate 102 may, for example, comprise silicon or some other suitable material. Further, the substrate 102 has a first doping type.

Figure 12:
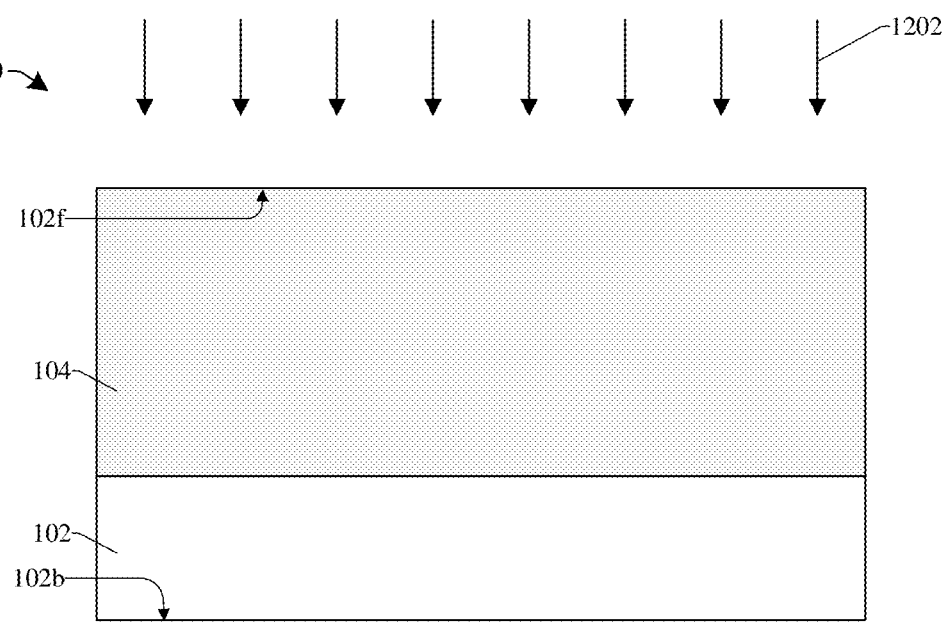

As shown in cross-sectional view 1200 of FIG. 12, a semiconductor well 104 is formed in the substrate 102 along a front-side 102f of the substrate 102. The semiconductor well 104 may, for example, be formed by an ion implantation process (e.g., denoted by arrows 1202), a diffusion process, or some other suitable process. Further, the semiconductor well 104 has a second doping type opposite the first doping type.

Figure 13:
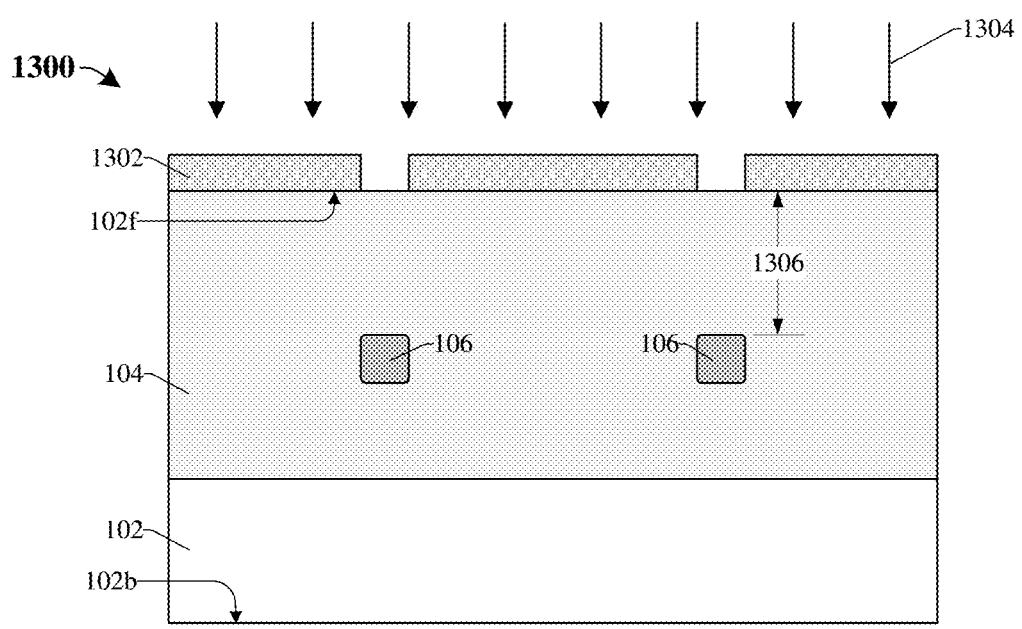

As shown in cross-sectional view 1300 of FIG. 13, a mask 1302 is formed over the substrate 102 along the front-side 102f of the substrate 102 and a PE semiconductor region 106 is formed in the semiconductor well 104 at a first depth 1306 with the mask 1302 in place. The PE semiconductor region 106 may, for example, be formed by an ion implantation process (e.g., denoted by arrows 1304), a diffusion process, or some other suitable process. Further, the PE semiconductor region 106 has the second doping type.

In some embodiments, the mask 1302 may comprise photoresist, silicon oxide, silicon nitride, titanium oxide, titanium nitride, or some other suitable material.

Figure 14:
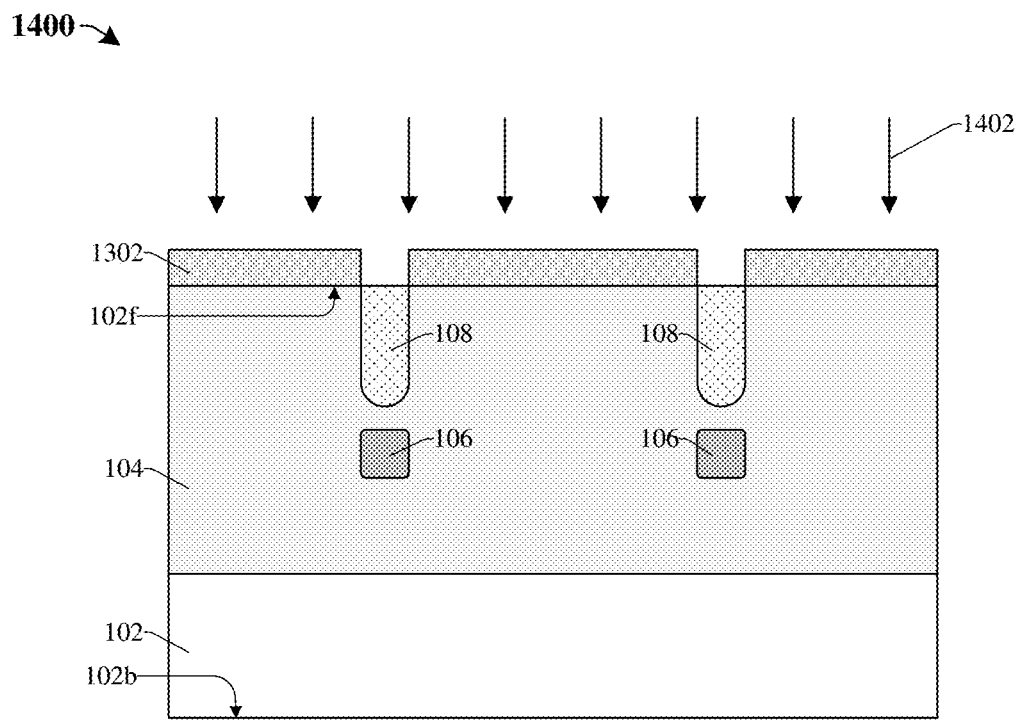

As shown in cross-sectional view 1400 of FIG. 14, a guard ring semiconductor region 108 is formed in the semiconductor well 104 along the front-side 102f of the substrate 102. The guard ring semiconductor region 108 may, for example, be formed by an ion implantation process (e.g., denoted by arrows 1402), a diffusion process, or some other suitable process. Further, the guard ring semiconductor region 108 has the first doping type.

In some embodiments, the guard ring semiconductor region 108 may be formed with the mask 1302 in place such that the guard ring semiconductor region 108 and the PE semiconductor region 106 have the same top layout. In some other embodiments, the guard ring semiconductor region 108 may be formed with a different mask (not shown) in place such that the guard ring semiconductor region 108 and the PE semiconductor region 106 have different top layouts (see, for example, FIGS. 5 and 6).

Figure 15:
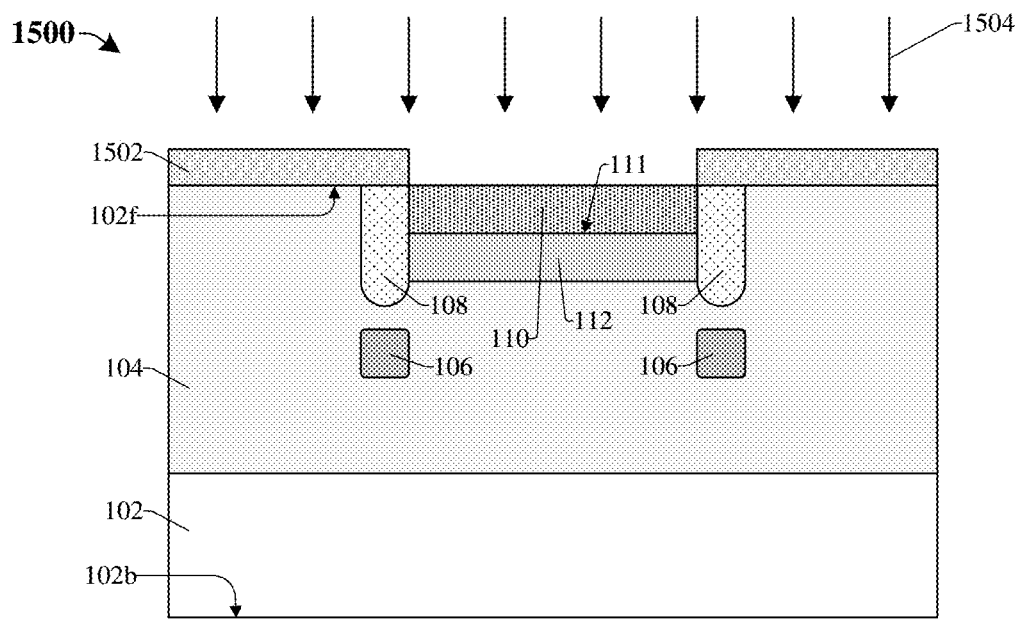

As shown in cross-sectional view 1500 of FIG. 15, a mask 1502 is formed over the substrate 102 along the front-side 102f of the substrate 102. In addition, a first semiconductor region 110 and a second semiconductor region 112 are formed in the semiconductor well 104 between inner sidewalls of the guard ring semiconductor region 108 to establish a p-n junction 111 in the semiconductor well 104. The first semiconductor region 110 is formed directly over the second semiconductor region 112. The first semiconductor region 110 and the second semiconductor region 112 may, for example, be formed by one or more ion implantation processes (e.g., denoted by arrows 1504), diffusion processes, or some other suitable processes. Further, the first semiconductor region 110 has the first doping type and the second semiconductor region 112 has the second doping type.

In some embodiments, the mask 1502 may comprise photoresist, silicon oxide, silicon nitride, titanium oxide, titanium nitride, or some other suitable material.

In some embodiments, a common mask (e.g., mask 1502) may be used when forming both the first and second semiconductor regions 110, 112 such that both the first and second semiconductor regions 110, 112 have a same top layout. In some other embodiments, different masks (not shown) may be used when forming the first and second semiconductor regions 110, 112 to form a gap (e.g., 112d of FIG. 4) between the second semiconductor region 112 and the guard ring semiconductor region 108. In such embodiments, the first and second semiconductor regions 110, 112 have different top layouts.

Although FIGS. 13-15 illustrate the PE semiconductor region 106 and the guard ring semiconductor region 108 being formed before the first and second semiconductor regions 110, 112 are formed, it will be appreciated that in some embodiments (not shown), the first and second semiconductor regions 110, 112 may alternatively be formed before the PE semiconductor region 106 and the guard ring semiconductor region 108 are formed.

Figure 16:
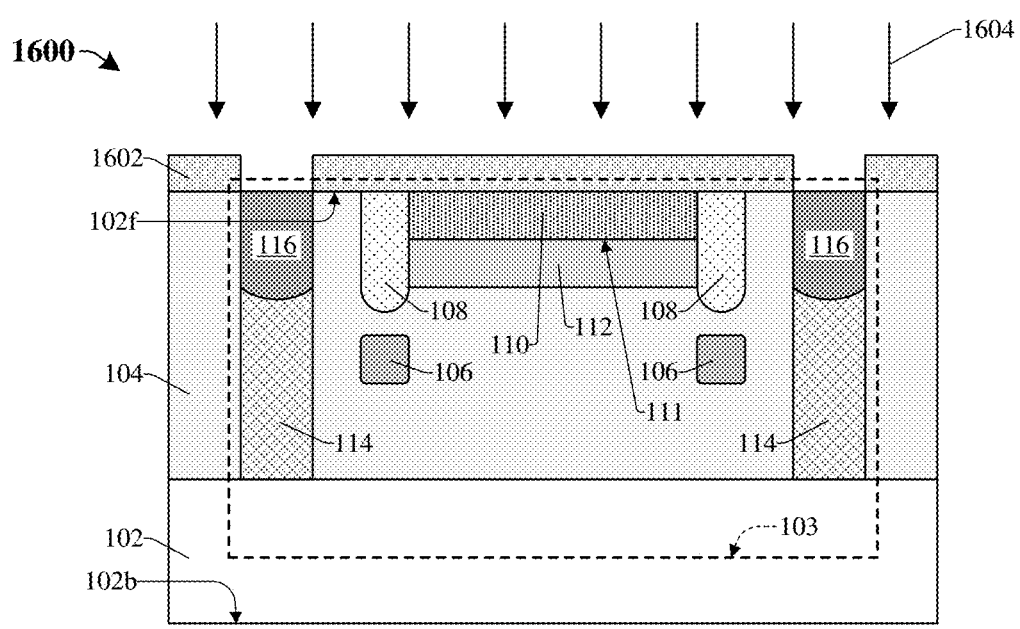

As shown in cross-sectional view 1600 of FIG. 16, a mask 1602 is formed over the substrate 102 along the front-side 102f of the substrate 102. In addition, an isolation semiconductor region 114 and a contact semiconductor region 116 are formed in the semiconductor well 104 with the mask 1602 in place. The isolation semiconductor region 114 and the contact semiconductor region 116 may, for example, be formed by one or more ion implantation processes (e.g., denoted by arrows 1604), diffusion processes, or some other suitable processes. The isolation semiconductor region 114 and the contact semiconductor region 116 have the second doping type.

In some embodiments, the forming of the contact semiconductor region 116 may be the final step in the formation of the photodetector 103.

Figure 17:
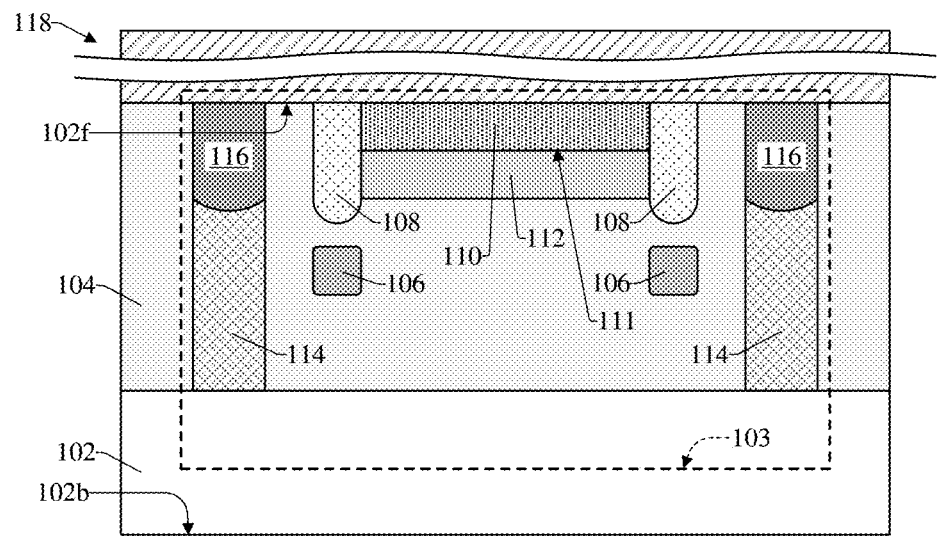

As shown in cross-sectional view 1700 of FIG. 17, an interconnect structure 118 is formed over the substrate 102 along the front-side 102f of the substrate 102. The interconnect structure may, for example, be formed by any of a deposition process, an etching process, a planarization process, or some other suitable process.

Figure 18:
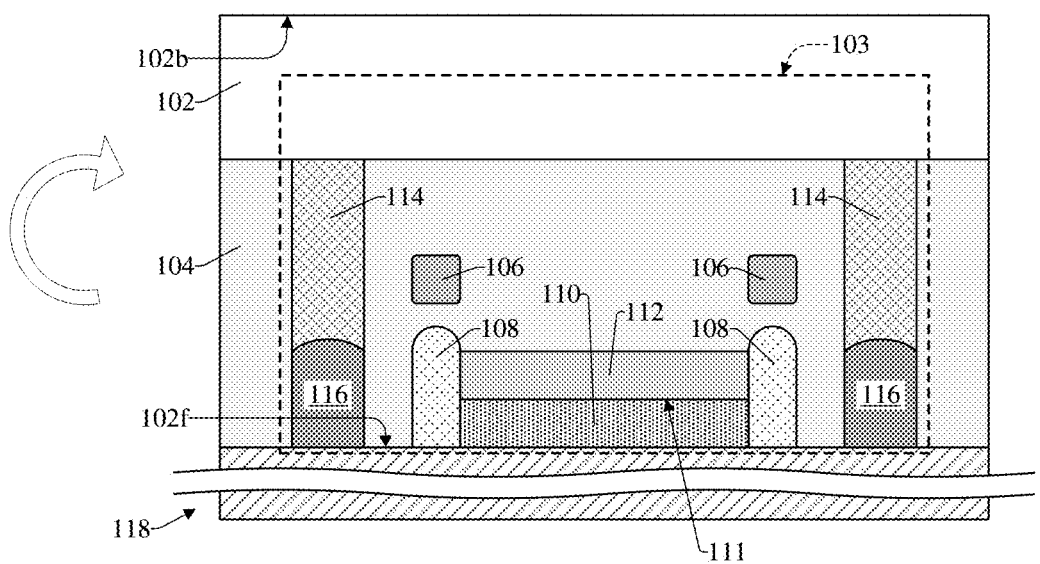

As shown in cross-sectional view 1800 of FIG. 18, the substrate 102 is rotated such that a back-side 102b of the substrate 102 is over the front-side 102f.

Figure 19:
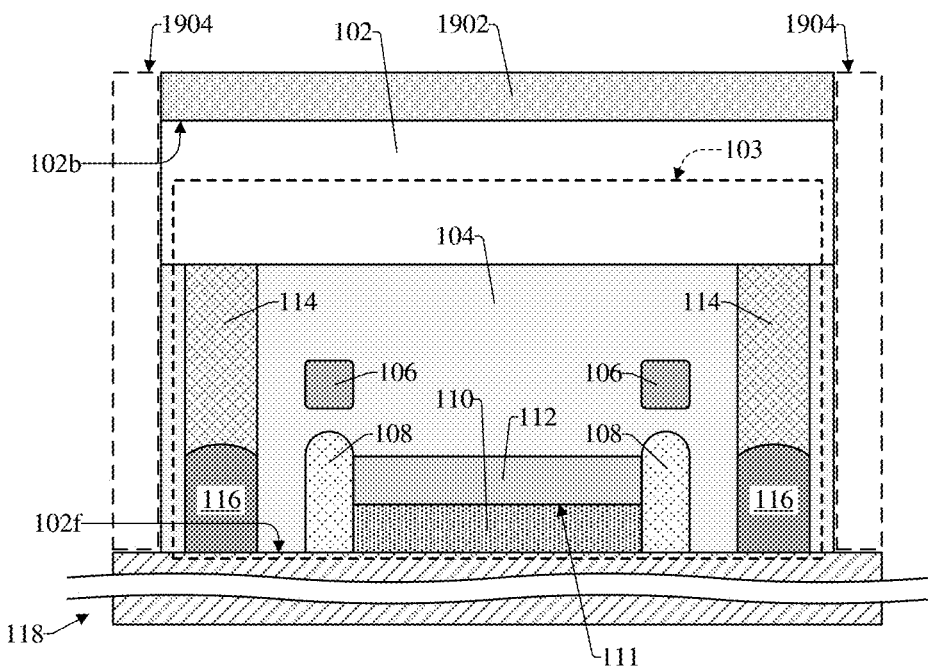

As shown in cross-sectional view 1900 of FIG. 19, a mask 1902 is formed over the substrate 102 along the back-side 102b of the substrate 102. In addition, the substrate 102 and the semiconductor well 104 are patterned with the mask 1902 in place to form an isolation opening 1904 that surrounds the photodetector 103.

Figure 20:
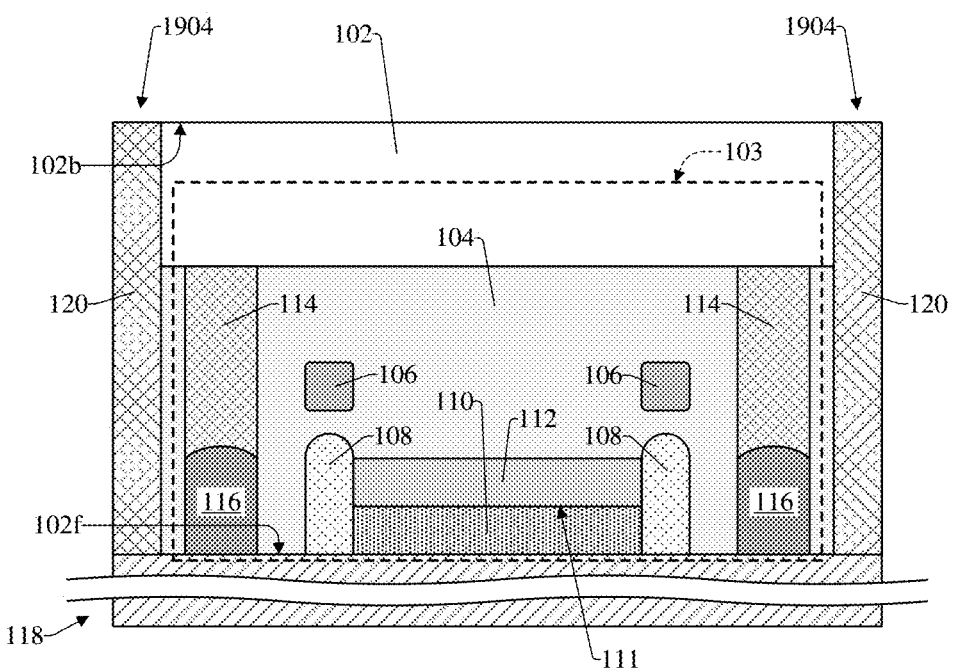

As shown in cross-sectional view 2000 of FIG. 20, a dielectric material is deposited in the isolation opening 1904 and the dielectric material is planarized to form a trench isolation structure 120 in the isolation openings 1904. The dielectric material may, for example, comprise silicon oxide, silicon nitride, aluminum oxide, aluminum nitride, some other suitable dielectric, or any combination of the foregoing, and may be deposited by any of a chemical vapor deposition (CVD) process, a physical vapor deposition (PVD) process, an atomic layer deposition (ALD) process, a spin-on process, or some other suitable deposition process. Further, the planarization process may, for example, comprise a chemical mechanical planarization (CMP) or some other suitable planarization process.

Although the trench isolation structure 120 is illustrated as being formed from the back-side 102b of the substrate, it will be appreciated that in some alternative embodiments, the trench isolation structure 120 may alternatively be formed from the front-side 102f of the substrate 102 before the interconnect structure 118 is formed along the front-side 102f of the substrate 102.

Figure 21:
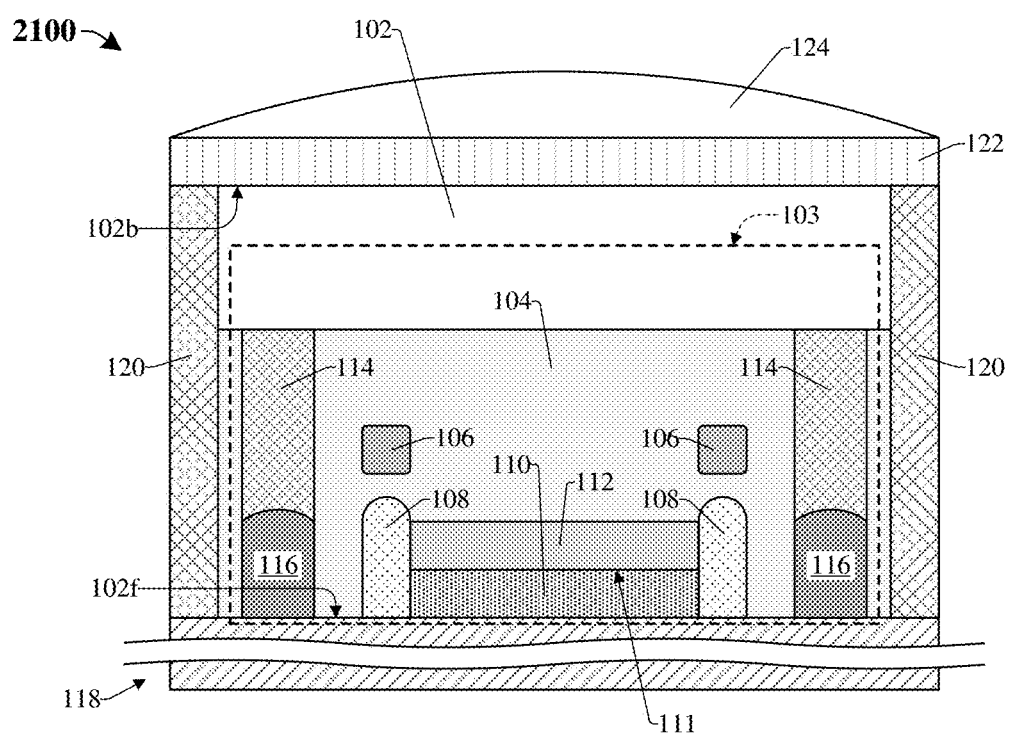

As shown in cross-sectional view 2100 of FIG. 21, a color filter 122 is formed over the substrate 102 along the back-side 102b of the substrate 102. In addition, a lens 124 is formed over the color filter 122.

Although the color filter and lens 124 are illustrated as being formed along the back-side 102b of the substrate 102, it will be appreciated that in some other embodiments (see, for example, FIG. 8), the color filter and the lens 124 may alternatively be formed along the front-side 102f of the substrate 102.

Figure 22:
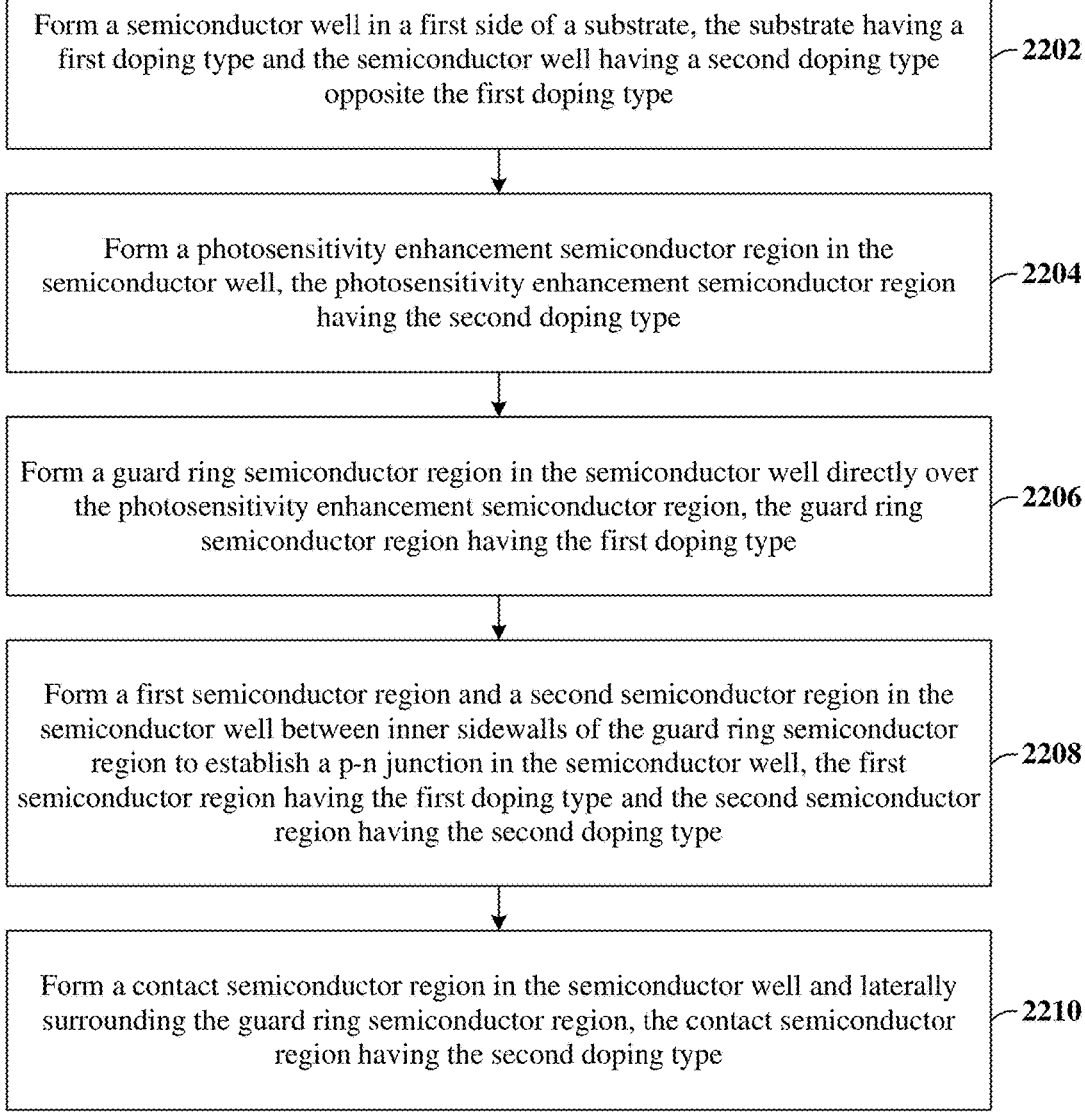
FIG. 22 illustrates a flow diagram of some embodiments of a method for forming an image sensor comprising a photosensitivity enhancement semiconductor region.

FIG. 22 illustrates a flow diagram of some embodiments of a method 2200 for forming an image sensor comprising a photosensitivity enhancement (PE) semiconductor region. While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, a semiconductor well is formed in a first side of a substrate, the substrate having a first doping type and the semiconductor well having a second doping type opposite the first doping type. FIG. 12 illustrates a cross-sectional view 1200 of some embodiments corresponding to act 2202.

At 2204, a photosensitivity enhancement semiconductor region is formed in the semiconductor well, the photosensitivity enhancement semiconductor region having the second doping type. FIG. 13 illustrates a cross-sectional view 1300 of some embodiments corresponding to act 2204.

At 2206, a guard ring semiconductor region is formed in the semiconductor well directly over the photosensitivity enhancement semiconductor region, the guard ring semiconductor region having the first doping type. FIG. 14 illustrates a cross-sectional view 1400 of some embodiments corresponding to act 2206.

At 2208, a first semiconductor region and a second semiconductor region are formed in the semiconductor well between inner sidewalls of the guard ring semiconductor region to establish a p-n junction in the semiconductor well, the first semiconductor region having the first doping type and the second semiconductor region having the second doping type. FIG. 15 illustrates a cross-sectional view 1500 of some embodiments corresponding to act 2208.

At 2210, a contact semiconductor region is formed in the semiconductor well and laterally surrounding the guard ring semiconductor region, the contact semiconductor region having the second doping type. FIG. 16 illustrates a cross-sectional view 1600 of some embodiments corresponding to act 2210.

Thus, the present disclosure relates to an image sensor comprising a photosensitivity enhancement (PE) semiconductor region for improving a performance of the image sensor.

Accordingly, in some embodiments, the present disclosure relates to an image sensor including a pixel along a substrate. The pixel comprises a first semiconductor region having a first doping type. A second semiconductor region is directly over the first semiconductor region. The second semiconductor region has a second doping type opposite the first doping type and meets the first semiconductor region at a p-n junction. A ring-shaped third semiconductor region laterally surrounds the first and second semiconductor regions. The ring-shaped third semiconductor region has the first doping type. A ring-shaped fourth semiconductor region laterally surrounds the ring-shaped third semiconductor region. The ring-shaped fourth semiconductor region has the second doping type. A ring-shaped fifth semiconductor region is directly over the ring-shaped third semiconductor region and has the second doping type.

In other embodiments, the present disclosure relates to an image sensor comprising a substrate. A semiconductor well is in the substrate along a first side of the substrate and has a first doping type. A first single-photon avalanche diode (SPAD) is in the semiconductor well along the first side of the substrate. The first SPAD comprises a first semiconductor region extending along the first side of the substrate and having a second doping type opposite the first doping type. A second semiconductor region is directly over the first semiconductor region and has the first doping type. The first semiconductor region meets the second semiconductor region at a p-n junction. A guard ring semiconductor region extends along the first side of the substrate and has the second doping type. The guard ring semiconductor region laterally surrounds the first and second semiconductor regions. A contact semiconductor region extends along the first side of the substrate and has the first doping type. The contact semiconductor region laterally surrounds the guard ring semiconductor region and is laterally separated from the guard ring semiconductor region by a first non-zero distance. A photosensitivity enhancement semiconductor region is directly over the guard ring semiconductor region and has the first doping type. The photosensitivity enhancement semiconductor region is configured to enlarge an area of the SPAD that is sensitive to photons.

In yet other embodiments, the present disclosure relates to a method for forming an image sensor. The method comprises forming a first semiconductor region and a second semiconductor region in a substrate. The first semiconductor region has a first doping type and the second semiconductor region has a second doping type opposite the first doping type. The first and second semiconductor regions meet at a p-n junction. A guard ring semiconductor region is formed in the substrate. The guard ring semiconductor region laterally surrounds the first semiconductor region and the second semiconductor region. The guard ring semiconductor region has the first doping type. A contact semiconductor region is formed in the substrate. The contact semiconductor region laterally surrounds the guard ring semiconductor region and is laterally separated from the guard ring semiconductor region. The contact semiconductor region has the second doping type. A photosensitivity enhancement semiconductor region is formed in the substrate. The photosensitivity enhancement semiconductor region is directly over the guard ring semiconductor region. The photosensitivity enhancement semiconductor region has the second doping type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
   forming a first semiconductor region and a second semiconductor region in a substrate, wherein the first semiconductor region has a first doping type and the second semiconductor region has a second doping type opposite the first doping type, and wherein the first and second semiconductor regions meet at a p-n junction;
   forming a guard ring semiconductor region in the substrate, wherein the guard ring semiconductor region laterally surrounds the first semiconductor region and the second semiconductor region, and wherein the guard ring semiconductor region has the first doping type;
   forming a contact semiconductor region in the substrate, wherein the contact semiconductor region laterally surrounds the guard ring semiconductor region and is laterally separated from the guard ring semiconductor region, and wherein the contact semiconductor region has the second doping type; and
   forming a photosensitivity enhancement semiconductor region in the substrate, wherein the photosensitivity enhancement semiconductor region is directly over the guard ring semiconductor region, and wherein the photosensitivity enhancement semiconductor region has the second doping type.

2. The method of claim 1, wherein the photosensitivity enhancement semiconductor region is formed with a first mask in place and the guard ring semiconductor region is subsequently formed with the first mask in place.

3. The method of claim 1, wherein the photosensitivity enhancement semiconductor region is formed with a first mask in place and the guard ring semiconductor region is subsequently formed with a second mask different from the first mask in place.

4. The method of claim 1, wherein the guard ring semiconductor region and the first semiconductor region extend along a first side of the substrate, and wherein the second semiconductor region and the photosensitivity enhancement semiconductor region are vertically spaced from the first side of the substrate.

5. The method of claim 1, wherein the photosensitivity enhancement semiconductor region and the guard ring semiconductor region have ring-shaped top layouts.

6. The method of claim 1, wherein a bottom of the photosensitivity enhancement semiconductor region meets a top of the guard ring semiconductor region.

7. The method of claim 1, wherein a width of the photosensitivity enhancement semiconductor region is greater than a width of the guard ring semiconductor region, and wherein sides of the guard ring semiconductor region are directly under a bottom of the photosensitivity enhancement semiconductor region.

8. The method of claim 1, further comprising:
   forming an isolation semiconductor region in the substrate and directly under the contact semiconductor region.

9. A method for forming an image sensor, the method comprising:
- forming a photosensitivity enhancement semiconductor region in a semiconductor substrate and vertically spaced from a first side of the semiconductor substrate, the photosensitivity enhancement semiconductor region having a second doping type;
- forming a guard ring semiconductor region in the semiconductor substrate along the first side of the semiconductor substrate and directly over the photosensitivity enhancement semiconductor region, the guard ring semiconductor region having a first doping type different than the second doping type;
- forming a first semiconductor region and a second semiconductor region in the semiconductor substrate along the first side of the semiconductor substrate and between sides of the guard ring semiconductor region, the first semiconductor region directly over the second semiconductor region, the first and second semiconductor regions meeting at a p-n junction, the first semiconductor region having the first doping type, the second semiconductor region having the second doping type; and
- forming a contact semiconductor region in the semiconductor substrate along the first side of the semiconductor substrate and laterally surrounding the guard ring semiconductor region, the contact semiconductor region having the second doping type.

10. The method of claim 9, wherein the photosensitivity enhancement semiconductor region has a first ring-shaped top layout and the guard ring semiconductor region has a second ring-shaped top layout.

11. The method of claim 10, wherein the photosensitivity enhancement semiconductor region is formed with a first mask in place, and wherein the guard ring semiconductor region is subsequently formed with the first mask in place such that the first ring-shaped top layout is approximately the same as the second ring-shaped top layout.

12. The method of claim 10, wherein the photosensitivity enhancement semiconductor region is formed with a first mask in place, and wherein the guard ring semiconductor region is subsequently formed with a second mask in place, the second mask being different than the first mask such that that the second ring-shaped top layout is skinnier than the first ring-shaped top layout.

13. The method of claim 9, wherein a doping concentration of the photosensitivity enhancement semiconductor region is less than a doping concentration of the first semiconductor region.

14. The method of claim 9, wherein a side of the second semiconductor region is laterally spaced from a side of the guard ring semiconductor region.

15. A method for forming an image sensor, the method comprising:
- implanting a first semiconductor region and a second semiconductor region in a semiconductor substrate, the first semiconductor region extending along a first side of the semiconductor substrate, the second semiconductor region directly under the second semiconductor region, the first and second semiconductor regions meeting at a p-n junction, the first semiconductor region having a first doping type, the second semiconductor region having a second doping type different than the first doping type;
- implanting a photosensitivity enhancement semiconductor region in the semiconductor substrate and vertically spaced from the first side of the semiconductor substrate, the photosensitivity enhancement semiconductor region below the second semiconductor region, the photosensitivity enhancement semiconductor region having the second doping type;
- implanting a guard ring semiconductor region in the semiconductor substrate along the first side of the semiconductor substrate and laterally surrounding the first and second semiconductor regions, the guard ring semiconductor region directly over and vertically spaced from the photosensitivity enhancement semiconductor region, the guard ring semiconductor region having the first doping type; and
- implanting a contact semiconductor region in the semiconductor substrate along the first side of the semiconductor substrate and laterally surrounding the guard ring semiconductor region, the contact semiconductor region having the second doping type.

16. The method of claim 15, wherein the guard ring semiconductor region has a first ring-shaped top layout and the photosensitivity enhancement semiconductor region has a second ring-shaped top layout.

17. The method of claim 16, wherein the first ring-shaped top layout and the second ring-shaped top layout are centered about a common axis.

18. The method of claim 15, wherein the guard ring semiconductor region extends into the semiconductor substrate from the first side of the semiconductor substrate to a first distance from the first side of the semiconductor substrate, and wherein the guard ring semiconductor region is vertically spaced from the photosensitivity enhancement semiconductor region by a second distance, less than the first distance.

19. The method of claim 15, wherein the doping type of the photosensitivity enhancement semiconductor region is different than the doping type of the guard ring semiconductor region that is directly over the photosensitivity enhancement semiconductor region.

20. The method of claim 15, wherein a width of the photosensitivity enhancement semiconductor region is approximately equal to a width of the guard ring semiconductor region.

* * * * *